United States Patent [19]

Hwang et al.

[11] Patent Number: 4,634,744

[45] Date of Patent: Jan. 6, 1987

[54] METHOD OF CATALYST DEACTIVATION

[75] Inventors: Yu-Tang Hwang; Lloyd Pebsworth, both of Clinton, Iowa; Robert A. Dombro; Raymond E. Hoff, both of Palatine, Ill.

[73] Assignee: Chemplex Company, Rolling Meadows, Ill.

[21] Appl. No.: 689,953

[22] Filed: Jan. 9, 1985

[51] Int. Cl.$^4$ ............................................. C08F 2/38
[52] U.S. Cl. ...................................... 526/84; 526/82; 526/83; 526/85
[58] Field of Search ..................... 526/84, 82, 83, 85

[56] References Cited

U.S. PATENT DOCUMENTS

| | | | |
|---|---|---|---|
| Re. 29,004 | 10/1976 | Cupples et al. | 528/485 |
| 2,985,617 | 5/1961 | Salyer et al. | 260/45.7 |
| 3,009,907 | 11/1961 | Mahlman et al. | 260/93.7 |
| 3,154,529 | 10/1964 | Kobayashi et al. | 260/93.7 |
| 3,164,578 | 1/1965 | Baker | 260/94.9 |
| 3,192,192 | 6/1965 | Hartnett | 260/93.7 |
| 3,261,900 | 7/1966 | Spillers | 264/140 |
| 3,265,649 | 8/1966 | Faltings et al. | 260/23 |
| 3,356,670 | 12/1967 | Rudner et al. | 260/94.9 |
| 3,393,182 | 7/1968 | Trepka | 260/79.5 |
| 3,476,698 | 11/1969 | Osterrieth et al. | 260/23 |
| 3,520,866 | 7/1970 | Bacskai | 260/93.7 |
| 3,657,114 | 4/1972 | Smith | 260/23 H |
| 3,773,743 | 11/1973 | Ainsworth, Jr. et al. | 260/94.9 F |
| 3,876,600 | 4/1975 | Cupples et al. | 260/93.7 |
| 3,888,789 | 6/1975 | Dombro et al. | 252/429 B |
| 3,944,533 | 3/1976 | Beck et al. | 260/93.1 |
| 3,992,322 | 11/1976 | Dombro et al. | 252/429 B |
| 4,104,247 | 8/1978 | Kato et al. | 260/45.7 R |
| 4,105,609 | 8/1978 | Machon et al. | 526/84 X |
| 4,105,647 | 8/1978 | O'Farrell et al. | 526/33 |
| 4,105,842 | 8/1978 | Nicco et al. | 526/65 |
| 4,130,699 | 12/1978 | Hoff et al. | 526/67 |
| 4,156,075 | 5/1979 | Holliday et al. | 528/483 |
| 4,168,356 | 9/1979 | Levresse et al. | 526/64 |
| 4,284,762 | 8/1981 | Miyata et al. | 528/485 |
| 4,303,766 | 12/1981 | O'Farrell et al. | 525/353 |
| 4,326,048 | 4/1982 | Stevens et al. | 526/68 |
| 4,347,353 | 8/1982 | Miyata et al. | 528/485 |
| 4,379,882 | 4/1983 | Miyata | 528/485 X |
| 4,425,464 | 1/1984 | Allen et al. | 524/400 |
| 4,430,488 | 2/1984 | Zboril | 526/84 |

FOREIGN PATENT DOCUMENTS

| | | |
|---|---|---|
| 0067645 | 12/1982 | European Pat. Off. |
| 118092 | 9/1984 | European Pat. Off. |
| 2621591 | 5/1976 | Fed. Rep. of Germany |
| 57-158206 | 9/1982 | Japan |
| 2104083 | 3/1983 | United Kingdom |

OTHER PUBLICATIONS

Miyata, in *Clays and Clay Minerals*, vol. 28, No. 1 at 50-56, (1980).
Chemical Abstracts 126830s, (1971).
Chemical Abstracts 85:143809m, (1976).
Chemical Abstract No. 96:36263j, (1982).

*Primary Examiner*—Paul R. Michl
*Assistant Examiner*—Alex H. Walker
*Attorney, Agent, or Firm*—Wood, Dalton, Phillips, Mason & Rowe

[57] ABSTRACT

An improved method of terminating ethylene polymerization and interpolymerization reactions by deactivating the Ziegler-type catalyst used in the reaction comprises the step of injecting a selected deactivating agent into the molten polymer solution in the polymerization reactor prior to degassing of the polymer solution.

The deactivating agent is selected from the group consisting of:
(a) natural hydrotalcite minerals and synthetic hydrotalcite-like materials;
(b) Group IIIA metal salts of monocarboxylic acids;
(c) alkali metal and alkaline earth metal salts of alkarylsulfonic acids;
(d) alkali metal and alkaline earth metal salts of alkyl and alkaryl sulfuric acids;
(e) organophosphites of a formula selected from the group consisting of $(RO)_3P$ and $(RO)_2POH$ where R is a hydrocarbon group containing 1 to 22 carbon atoms, inclusive;
(f) ethoxylated hydrocarbylamines of the formula $R'_{3-n}N[(OCH_2CH_2)_mOH]_n$ where R' is hydrogen or a hydrocarbon group containing 1 to 22 carbon atoms, inclusive, and at least one R' is a hydrocarbon group, n is 1 or 2, and m is an integer between 1 and 22, inclusive;
(g) monocarboxylic acid esters of triethanolamine of the formula $(RCOOCH_2CH_2)_3N$ where R is a hydrocarbon group containing 1 to 22 carbon atoms, inclusive; and
(h) organotin salts of maleic acid of the formula $[-Sn(R)_2OOCCH=CHCOO-]$ where R is a hydrocarbon group containing 1 to 22 carbon atoms, inclusive.

31 Claims, No Drawings

METHOD OF CATALYST DEACTIVATION

BACKGROUND OF THE INVENTION

1. Field of the Invention

This invention relates generally to a method of terminating ethylene polymerization and copolymerization processes and, more specifically, this invention relates to an improvement in the deactivation of Ziegler catalysts used in such polymerization processes.

2. Description of the Prior Art

In polyethylene production generally, and especially in the production of high density polyethylene (HDPE) or linear low density polyethylene copolymers (LLDPE) in high pressure reactors, it is necessary to terminate the polymerization reaction at a desired point in order to prevent the production of undesirable products, such as waxes and low molecular weight materials such as oligomers.

Typically in such processes, a transition metal derivative-containing catalyst (conventionally referred to as a "Ziegler catalyst") in combination with an organometallic cocatalyst is contacted with ethylene, or ethylene and one or more 1-olefin or diolefin comonomers having at least three carbon atoms, under conditions of moderate to high pressure and high temperature. Under such conditions, ethylene is a liquid and acts as a solvent for the product polymer.

Typically, the product polymer is discharged from the reactor in the form of a molten polymer solution stream into one or more relatively low pressure separators where gaseous monomer and comonomer are removed from the polymer.

The molten polymer solution stream actively polymerizes as it leaves the reactor, since catalyst components remain in the stream. Thus, it is necessary to terminate the polymerization reaction by deactivating the catalyst components in order to avoid the production of undesirable by-products.

One prior method of terminating ethylene polymerization reactions is disclosed in U.S. Pat. No. 4,105,609 (Machon et al) issued Aug. 8, 1978. The Machon et al patent describes the use of an alkali metal salt or alkaline earth metal salt of a carboxylic acid, such as calcium stearate, as a deactivating agent for a Ziegler catalyst.

Other prior art deactivation methods utilize such deactivating agents as humidified calcium stearate, salts of alkali metals, inorganic polybasic acids plus water, or water combined with an alkaline earth metal or zinc salt of an aliphatic monocarboxylic acid of 6 to 22 carbon atoms. Other prior deactivating agents include aqueous nonionic surfactants and flux-calcined diatomite.

None of the prior methods of catalyst deactivation have been completely satisfactory in terminating ethylene polymerization and copolymerization processes.

SUMMARY OF THE INVENTION

It is an object of the present invention to overcome one or more of the problems described above.

According to the present invention, a selected catalyst deactivating agent (sometimes referred to herein as "deactivator") is injected into an actively polymerizing molten polymer solution stream containing Ziegler-type catalyst components prior to discharge of the stream from the polymerization reactor and prior to degassing of the polymer stream.

The deactivating agent comprises one or more agents selected from the group consisting of:

(a) natural hydrotalcite minerals and synthetic hydrotalcite-like materials;

(b) Group IIIA metal salts of monocarboxylic acids;

(c) alkali metal and alkaline earth metal salts of alkarylsulfonic acids;

(d) alkali metal and alkaline earth metal salts of alkyl and alkaryl sulfuric acids;

(e) organophosphites of a formula selected from the group consisting of $(RO)_3P$ and $(RO)_2POH$ where R is a hydrocarbon group containing 1 to 22 carbon atoms, inclusive;

(f) ethoxylated hydrocarbylamines of the formula $R'_{3-n}N[(OCH_2CH_2)_mOH]_n$ where R' is hydrogen or a hydrocarbon group containing 1 to 22 carbon atoms, inclusive, and at least one R' is a hydrocarbon group, n is 1 or 2, and m is an integer between 1 and 22, inclusive;

(g) monocarboxylic acid esters of triethanolamine of the formula $(RCOOCH_2CH_2)_3N$ where R is a hydrocarbon group containing 1 to 22 carbon atoms, inclusive; and (h) organotin salts of maleic acid of the formula $[-Sn(R)_2OOCCH=CHCOO-]$ where R is a hydrocarbon group containing 1 to 22 carbon atoms, inclusive.

The deactivating agent and products of reaction between the agent and the components of the catalyst remain in the polymer and act as halogen scavengers, thus providing a corrosion inhibiting effect.

The catalyst is quickly and effectively deactivated, thus preventing processing complications downstream from the reactor, such as the formation of waxes and oligomers.

Further objects and advantages of the invention will be apparent to those skilled in the art from a review of the following detailed description and the appended claims.

DETAILED DESCRIPTION OF THE INVENTION

The invention is useful in methods of continuously polymerizing, copolymerizing or terpolymerizing ethylene or ethylene and at least one 1-olefin or diolefin having at least three carbon atoms under various polymerizing conditions of pressure and temperature. The invention is especially useful in polymerization procedures utilizing medium to high pressures and high temperatures.

The preferred high temperature range is between about 130° C. and 300° C., inclusive, with pressures preferably in the range of about 10,000 to about 25,000 psig, inclusive.

Polymerization methods of this type are generally described in Machon et al U.S. Pat. No. 4,105,609, issued August 8, 1978, the disclosure of which is incorporated herein by reference.

The polymerization reaction is carried out in a reactor of any convenient type, including stirred autoclave reactors, tubular reactors, or in a series of reactors of either the autoclave or tubular type. The polymerization conditions are selected such that the reaction mixture of monomer, comonomer (if present), and product polymer is homogeneous, i.e., the polymer is soluble in the reaction mixture.

If desired, chain transfer agents, such as hydrogen, or liquid diluents, such as liquid alkanes, may be present.

As is well known in the art, the molten polymer solution stream is discharged from the reactor to a separator or series of separators which operate at low pressures relative to that of the reactor, wherein the polymer is separated from the polymer solution stream by vaporization of the monomer and comonomer, which are recycled to the reactor.

The polymer solution stream which is discharged from the reactor contains catalyst components. The invention broadly contemplates the use of transition metal derivative-containing catalysts, conventionally referred to as "Ziegler catalysts," which include an organometallic cocatalyst, such as an alkyl aluminum compound-containing cocatalyst.

Such catalysts are well known in the art, and the selection of the particular catalyst is not critical to the practice of this invention. In general, however, such catalysts contain a transition metal, preferably titanium and/or vanadium, along with a Group IIA metal compound such as an organomagnesium compound, and an organoaluminum compound.

According to the invention, the selected catalyst deactivator is injected directly into the actively polymerizing molten polymer solution stream at a point in the reactor prior to discharge of the stream from the reactor and prior to degassing of the polymer stream. The deactivator may be introduced to the polymer stream in dry form, in admixture with water, or as a solution or suspension in an inert liquid diluent such as mineral spirits, for example. Preferably, the material is used in slurry form in an inert liquid diluent.

The amount of deactivator injected into the polymer stream must be sufficient to ensure deactivation of the catalyst. Deactivation is effected by destruction of at least one of the constituents of the catalyst, i.e., the transition metal derivative and/or the organometallic cocatalyst. It is preferred, however, to use sufficient deactivator to react with all of the metallic components of the catalyst. Preferably, between about 0.1 and about 10 moles, inclusive, of deactivator are used for each mole of metal in the total catalyst, which includes the transition metal and cocatalyst components thereof.

Deactivation of a Ziegler catalyst in an actively polymerizing molten polymer solution stream according to the invention results in rapid, effective deactivation of the polymerization reaction, thus preventing the production of undesirable by-products such as waxes and low molecular weight by-products such as oligomers. The deactivating agent reacts with the metallic components of the Ziegler catalyst system, and the reaction products remain in the product polymer.

An important benefit of the invention is the halogen scavenging utility of the deactivating compounds, which significantly inhibits corrosion of process equipment when the deactivating compound and its products of reaction with the components of the catalyst system remain in the polymer. For example, chloride in the catalyst is effectively neutralized according to the invention. The invention also provides ready control of the composition of the gases recycled to the reactor from the low pressure separators, thus allowing for ready control of the constituents present during the polymerization reaction.

According to the invention, the deactivating agent is one or more compounds selected from the group consisting of:

(a) natural hydrotalcite minerals and synthetic hydrotalcite-like materials;

(b) Group IIIA metal salts of monocarboxylic acids;

(c) alkali metal and alkaline earth metal salts of alkarylsulfonic acids;

(d) alkali metal and alkaline earth metal salts of alkyl and alkaryl sulfuric acids;

(e) organophosphites of a formula selected from the group consisting of $(RO)_3P$ and $(RO)_2POH$ where R is a hydrocarbon group containing 1 to 22 carbon atoms, inclusive;

(f) ethoxylated hydrocarbylamines of the formula $R'_{3-n}N[(OCH_2CH_2)_mOH]_n$ where R' is hydrogen or a hydrocarbon group containing 1 to 22 carbon atoms, inclusive, and at least one R' is a hydrocarbon group, n is 1 or 2, and m is an integer between 1 and 22, inclusive;

(g) monocarboxylic acid esters of triethanolamine of the formula $(RCOOCH_2CH_2)_3N$ where R is a hydrocarbon group containing 1 to 22 carbon atoms, inclusive; and (h) organotin salts of maleic acid of the formula $[-Sn(R)_2OOCCH=CHCOO-]$ where R is a hydrocarbon group containing 1 to 22 carbon atoms, inclusive.

The hydrotalcite material may be natural mineral or a synthetic hydrotalcite-like material, and may be used in dried (calcined or anhydrous) or partially dried form and may, if desired, contain a surface active agent, preferably an anionic surface active agent.

The hydrotalcite materials of the invention are generally defined as "magnesium-aluminum-hydroxide carbonate hydrates," but need not contain carbonates.

An example of a synthetic hydrotalcite is a material having the formula $Mg_6Al_2(OH)_{16}CO_3.4H_2O$. A synthetic hydrotalcite-like compound available from Kyowa Chemical Company Ltd. under the trademark DHT-4A has the formula $Mg_{4.5}Al_2(OH)_{13}CO_3.3.5H_2O$. A form containing less water of hydration (i.e., less than 3.5 moles of water of hydration per mole of compound) is designated DHT-4AA.

A general formula for some hydrotalcite-like materials is $Mg_{1-x}Al_x(OH)_2A_{x/b}^{b-} \cdot dH_2O$ where x is greater than 0 and less than or equal to 0.5, d is zero or a positive number, b is a positive integer, and $A^{b-}$ in an anion having a valence of b. Such materials are described in U.S. Pat. Nos. 4,284,762 (Aug. 8, 1981) and 4,347,353 (Aug. 31, 1982) to Miyata et al, the respective disclosures of which are incorporated herein by reference.

Synthetic hydrotalcites are described in detail in *Clays and Clay Minerals*, Vol. 28, No. 1 at pages 50–56 (1980), the disclosure of which is hereby incorporated by reference.

The hydrotalcite need not contain carbonate, and one type of carbonate-free hydrotalcite material useful in the invention has the general formula $Mg_{1-x}Al_x(OH)_{2+x} \cdot aH_2O$, where x is greater than zero and less than or equal to 0.5, and a is greater than or equal to zero and less than 2. This type of material is described in U.S. Pat. No. 4,379,882 (Apr. 12, 1983) to Miyata, the disclosure of which is incorporated herein by reference.

One specific carbonate-free synthetic hydrotalcite which is also useful has the formula $Mg_{4.5}Al_2(OH)_{15}.3.5H_2O$.

The Group IIIA metal salts of monocarboxylic acids may contain some free monocarboxylic acid, if desired. An example of Group IIIA metal salt of the invention is aluminum stearate.

The alkali metal or alkaline earth metal salts of alkarylsulfonic acid are of the general formula $(RC_6H_4SO_3)_cM$ where M is an alkali or alkaline earth metal, c equals the valence of M, and R is a hydrocarbon group having from 1 to 22 carbon atoms. Examples are sodium and calcium dodecylbenzene sulfonates.

The alkali metal or alkaline earth metal salts of alkyl or alkaryl sulfuric acids have the general formula $(RO-SO_3)_cM$ where c, M and R are defined above. Examples are sodium dodecyl sulfate and sodium lauryl sulfate.

Examples of the organophosphites include tristearyl phosphite, distearyl phosphite, and trinonylphenylphosphite. These materials are commercially available from Borg-Warner Company under the trademarks Weston TSP, DSP and TNPP, respectively.

The ethoxylated hydrocarbylamines may be used in mixtures, if desired. An example of a suitable hydrocarbylamine is an ethoxylated stearylamine available from Witco Chemical Corporation under the trademark Kemamine AS 990.

One example of a monocarboxylic acid ester of triethanolamine is triethanolamine stearate.

An example of an organotin salt of maleic acid is dioctyltin maleate, which is available under the trademark Thermalite 813 from M & T Corporation.

EXAMPLES

The following specific Examples are given in order to illustrate the invention, but are not to be construed as limiting.

A series of ethylene/1-butene copolymerization tests was carried out in a one liter autoclave reactor equipped with a catalyst injector and a separate deactivator injector. Isopar H (Exxon) was used as a diluent. An alkyl aluminum cocatalyst, 500 psig ethylene and 15 wt. % 1-butene were placed in the reactor at 220° C, and a titanium/magnesium catalyst was injected under nitrogen pressure. The rate of reaction was monitored and, when peak reactivity was reached, the deactivator was injected under nitrogen pressure. The effectiveness of each deactivator was measured in terms of the number of seconds necessary to reach less than 5% ethylene flow after the deactivator was injected into the active polymerization zone, as compared to a blank test where no deactivator was added. In cases where ethylene flow reached less than 5% in about 30 seconds after the deactivator was injected into the mixture, the compound was considered an effective deactivator.

The results appear in the Table, below.

TABLE

| Example | Deactivator | Mole Ratio Deactivator to Catalyst[b] | Ethylene Flow at Time of Deactivator Injection, % | Maximum Ethylene Flow Reached, % | Time to Deactivate, Seconds[d] |
|---|---|---|---|---|---|
| 1 | None[a] | — | — | 55 | 120 |
| 2 | 220° C. Dried Synthetic Hydrotalcite[c] | 0.1 | 33 | 72 | no effect |
| 3 | 220° C. Dried Synthetic Hydrotalcite[c] | 0.15 | 30 | 55 | 33 |
| 4 | 220° C. Dried Synthetic Hydrotalcite[c] | 0.25 | 31 | 41 | 32 |
| 5 | 220° C. Dried Synthetic Hydrotalcite[c] | 1.0 | 27 | 72 | 23 |
| 6 | Synthetic Hydrotalcite[c] | 0.15 | n/a | n/a | 26 |
| 7 | Synthetic Hydrotalcite[c] | 1.5 | 46 | 46 | 16 |
| 8 | Aluminum Stearate[e] | 0.125 | 35 | 45 | 31 |
| 9 | Aluminum Stearate[e] | 0.25 | 64 | 64 | 27 |
| 10 | Aluminum Stearate[e] | 0.5 | 25 | 29 | 23 |
| 11 | Aluminum Stearate[e] | 1.0 | 17 | 24 | 23 |
| 12 | Sodium dodecylbenzene Sulfonate[f] | 0.25 | 62 | 83 | 50 |
| 13 | Sodium dodecylbenzene Sulfonate[f] | 0.5 | 46 | 46 | 28 |
| 14 | Sodium dodecylbenzene Sulfonate[f] | 1.0 | 39 | 49 | 24 |
| 15 | Calcium dodecylbenzene Sulfonate[g] | 0.125 | 51 | 51 | no effect |
| 16 | Calcium dodecylbenzene Sulfonate[g] | 0.25 | 44 | 44 | 20 |
| 17 | Calcium dodecylbenzene Sulfonate[g] | 0.5 | 51 | 51 | 26 |
| 18 | Sodium lauryl sulfate[h] | 0.5 | n/a | n/a | 22 |
| 19 | Sodium lauryl sulfate[h] | 1.0 | 52 | 70 | 28 |
| 20 | Tristearylphosphite[i] | 1 | 32 | 47 | 28 |
| 21 | Ethoxylated stearylamine[j] | 1 | 23 | 60 | 25 |
| 22 | Triethanolamine stearate[k] | 1 | 30 | 60 | 25 |
| 23 | Dioctyltin maleate[l] | 1 | 32 | 35 | 33 |
| 24 | $Mg_{4.5}Al_2(OH)_{15}.3.5H_2O$[m] | 1 | >30 | >30 | <30 |

Footnotes To Table
[a]Blank test.
[b]The catalyst contains titanium, magnesium and aluminum compounds.
[c]Used as a 15 wt. % slurry in Isopar H. Available from Kyowa Chemical, Ltd.
[d]Time required to reach 5% ethylene flow following deactivator injection.
[e]Grade V from Diamond Shamrock, 14 wt. % in Isopar H.
[f]Siponate DS-10 from Alcolac, Inc., 10 wt. % in Isopar H.
[g]Ninate 401 from Stepan Chemical Co., 10 wt. % in Isopar H.
[h]Stepan Chemical Co. product in Isopar H.
[i]Borg-Warner Chemical Co. product known as Weston TSP in Isopar H.
[j]Kemamine AS990 in Isopar H from Witco Chemical Corp.
[k]Emkay Chemical Co. product in Isopar H
[l]M & T Company product, Thermalite 813 in Isopar H.
[m]In Isopar H.

The foregoing detailed description is given for clearness of understanding only, and no unnecessary limitations are to be inferred therefrom, as modifications within the scope of the invention will be obvious to those skilled in the art.

We claim:

1. In a method of continuously homopolymerizing ethylene or interpolymerizing ethylene with one or more 1-olefins or diolefins having at least three carbon atoms wherein said ethylene or said ethylene and said one or more 1-olefins or diolefins are polymerized under polymerizing conditions in a reactor in the presence of a catalyst which comprises a transition metal derivative, and wherein the polymer so formed is discharged from said reactor in a molten solution stream containing components of said catalyst, and constituents of said stream are removed therefrom by vaporization at a pressure which is reduced compared to that of said reactor, the improvement which comprises the step of terminating said polymerization reaction by injecting into said molten solution prior to discharge of the same from said reactor and vaporization of components therefrom a catalyst deactivator in an amount effective to terminate said reaction, said deactivator comprising one or more members of the group consisting of:
  (a) natural hydrotalcite minerals and synthetic hydrotalcite-like materials selected from the group consisting of synthetic magnesium-aluminum-hydroxide-carbonate hydrates and synthetic magnesium-aluminum-hydroxide hydrates;
  (b) Group IIIA metal salts of monocarboxylic acids;
  (c) alkali metal and alkaline earth metal salts of alkarylsulfonic acids;
  (d) alkali metal and alkaline earth metal salts of alkyl and alkaryl sulfuric acids;
  (e) organophosphites of a formula selected from the group consisting of $(RO)_3P$ and $(RO)_2POH$ where R is a hydrocarbon group containing 1 to 22 carbon atoms, inclusive;
  (f) ethoxylated hydrocarbylamines of the formula $R'_{3-n}N[(OCH_2CH_2)_mOH]_n$ where R' is hydrogen or a hydrocarbon group containing 1 to 22 carbon atoms, inclusive, and at least one R' is a hydrocarbon group, n is 1 or 2, and m is an integer between 1 and 22, inclusive;
  (g) monocarboxylic acid esters of triethanolamine of the formula $(RCOOCH_2CH_2)_3N$ where R is a hydrocarbon group containing 1 to 22 carbon atoms, inclusive; and
  (h) organotin salts of maleic acid of the formula $[-Sn(R)_2OOCCH=CHCOO-]$ where R is a hydrocarbon group containing 1 to 22 carbon atoms, inclusive.

2. The improvement of claim 1 wherein said polymerization reaction is carried out at a temperature between about 130° C. and 300° C., inclusive.

3. The improvement of claim 1 wherein said polymerization is carried out at a pressure between about 10,000 and 25,000 psig, inclusive.

4. The improvement of claim 1 wherein between about 0.1 to 10 moles, inclusive, of said deactivator are injected per mole of metal in said catalyst.

5. The improvement of claim 1 wherein said deactivator is injected in dry form.

6. The improvement of claim 1 wherein said deactivator is suspended or dissolved in an inert liquid.

7. The improvement of claim 1 wherein said deactivator comprises a natural hydrotalcite mineral or synthetic hydrotalcite-like material of claim 1(a).

8. The improvement of claim 7 wherein said hydrotalcite has a formula selected from the group consisting of $Mg_6Al_2(OH)_{16}CO_3.4H_2O$, $Mg_{4.5}Al_2(OH)_{15}.3.5H_2O$, $Mg_{4.5}Al_2(OH)_{13}CO_3.3.5H_2O$, $Mg_{1-x}Al_x(OH)_{2+x}.aH_2O$ and $Mg_{1-x}Al_x(OH)_2A_{x/b}{}^{b-}/.dH_2O$ where $0<x<0.5$, a is greater than or equal to zero and less than two, b is a positive integer, d is zero or a positive number, and $A^{b-}$ is an anion having a valence of b.

9. The improvement of claim 8 wherein said hydrotalcite is at least partially dried.

10. The improvement of claim 8 wherein said hydrotalcite contains a surface active agent.

11. The improvement of claim 10 wherein said surface active agent is anionic.

12. The improvement of claim 1 wherein said deactivator comprises a Group IIIA metal salt of a monocarboxylic acid of claim 1(b).

13. The improvement of claim 12 wherein said deactivator comprises a mixture of said salt and free monocarboxylic acid.

14. The improvement of claim 12 wherein said deactivator comprises aluminum stearate.

15. The improvement of claim 1 wherein said deactivator comprises an alkali metal or alkaline earth metal salt of an alkarylsulfonic acid of claim 1(c).

16. The improvement of claim 15 wherein said salt is of the formula $(RC_6H_4SO_3)_cM$ where M is an alkali metal or alkaline earth metal, c is the valence of M, and R is a hydrocarbon group containing between 1 and 22 carbon atoms, inclusive.

17. The improvement of claim 16 wherein said salt comprises sodium dodecylbenzene sulfonate.

18. The improvement of claim 16 wherein said salt comprises calcium dodecylbenzene sulfonate.

19. The improvement of claim 1 wherein said deactivator comprises an alkali metal or alkaline earth metal salt of an alkyl or alkaryl sulfonic acid of claim 1(d).

20. The improvement of claim 19 wherein said salt is of the formula $(ROSO_3)_cM$ where M is an alkali metal or alkaline earth metal, c is the valence of M, and R is a hydrocarbon group of 1 to 22 carbon atoms.

21. The improvement of claim 20 wherein said salt comprises sodium dodecyl sulfate.

22. The improvement of claim 20 wherein said salt comprises sodium lauryl sulfate.

23. The improvement of claim 1 wherein said deactivator comprises an organophosphite of claim 1(e).

24. The improvement of claim 23 wherein said organophosphite is selected from the group consisting of tristearylphosphite, distearylphosphite and trinonylphenylphosphite.

25. The improvement of claim 1 wherein said deactivator comprises an ethoxylated hydrocarbylamine of claim 1(f).

26. The improvement of claim 25 wherein said hydrocarbylamine comprises ethoxylated stearylamine.

27. The improvement of claim 25 wherein said deactivator comprises a mixture of ethoxylated hydrocarbylamines.

28. The improvement of claim 1 wherein said deactivator comprises a monocarboxylic acid ester of triethanolamine of claim 1(g).

29. The improvement of claim 28 wherein said ester comprises triethanolamine stearate.

30. The improvement of claim 1 wherein said deactivator comprises an organotin salt of maleic acid of claim 1(h).

31. The improvement of claim 30 wherein said salt comprises dioctyltin maleate.

* * * * *